United States Patent [19]

Nakanouchi et al.

[11] Patent Number: 4,584,078

[45] Date of Patent: Apr. 22, 1986

[54] METHOD OF PRODUCING FINE PARTICLES

[75] Inventors: Yukio Nakanouchi, 9-8, Honcho 3-chome,, Ageo-shi, Saitama; Shigehiro Ohnuma, 4-126, Oidemae, Moniwa-aza; Tsuyoshi Masumoto, 8-22, Kamisugi 3-chome, both of Sendai-shi, Miyagi, all of Japan

[73] Assignees: Yukio Nakanouchi, Ageo; Shigehiro Ohnuma; Tsuyoshi Masumoto, both of Sendai; Research Development Corporation of Japan, Tokyo, all of Japan

[21] Appl. No.: 636,759

[22] Filed: Aug. 1, 1984

[30] Foreign Application Priority Data

Aug. 10, 1983 [JP] Japan .................................. 58-144923

[51] Int. Cl.$^4$ .............................................. C23C 15/00
[52] U.S. Cl. .................................. 204/192 R; 75/251; 75/254; 75/255; 204/192 M; 204/192 EC; 204/192 SP
[58] Field of Search ........ 204/192 SP, 192 R, 192 M, 204/192 EC

[56] References Cited

U.S. PATENT DOCUMENTS 4,396,643  8/1983  Kuehn et al. .................. 204/192 SP

OTHER PUBLICATIONS

Oya et al., Japan J. App. Phys.; 21 (1982) pp. 554–555.
Wehner, Advances in Electronics and Electron Physics, vol. 7, 1955, pp. 274–277.
Güntherschulze et al., Z. Physik, vol. 119 (1942) pp. 685–695.
Kirk–Othmer, Encyclopedia of Chemical Technology, 3rd Ed., 1983, vol. 19, pp. 36–37.

Primary Examiner—Arthur P. Demers
Attorney, Agent, or Firm—Flynn, Thiel, Boutell & Tanis

[57] ABSTRACT

A method of producing fine particles with a particle size of submicron or finer which comprises the steps of:
forming closely fine projections on a substrate surface, preferably by sputter-etching using an ionized gas; and then
sputtering metallic or non-metallic materials onto the thus treated substrate in an inert gas or a mixed gas of an inert gas and a reactive gas, such as oxygen, the gas pressure of the inert gas or the mixed gas being in the range of from $1 \times 10^{-4}$ torr to $1 \times 10^{-1}$ torr, and thereby depositing the purposed fine particles in crystalline or amorphous form. The invention method can successfully provide fine particles with desired properties, for example, in size, shape and structure, by adjusting producing conditions or selection of substrate materials and the thus obtained fine particles are very useful in various applications with or without the substrate.

8 Claims, 6 Drawing Figures $Fe_{80}B_{20}$ Amorphous Ultrafine Particle

METHOD OF PRODUCING FINE PARTICLES

BACKGROUND OF THE INVENTION

The present invention relates to a method of producing fine particles by a sputtering process and more particularly to a method of producing fine particles with a crystalline or amorphous structure in a high yield using a pretreated substrate.

In recent years, it has been found that fine particles with a particle size of submicron or smaller have useful properties, for example, a considerable increase in specific surface area, a lowering in melting point, a significant increase in surface activity, magnetically single domain, etc., which are different from the properties inherent in larger particles. Accordingly, such fine particles have been greatly expected as new industrial materials and many studies have been extensively made on the production of the particles and their properties. As a method of producing such fine particles, there has been well known a method involving heating metals or alloys and vaporizing in an inert gas, such as argon, helium, etc., under reduced pressure, and the method has now been industrialized. Further, recently, as a technique for the mass production of the fine metal particles, there has been developed a method utilizing the reaction between activated hydrogen and molten metal and much attention is paid to the new method. However, the two methods set forth above are based on vaporizing phenomenon or the like and, thus, are unsuitable for producing fine particles from alloys or compounds comprising a few elements each having a different vapor pressure.

Recently, the sputtering phenomenon has been practically applied to thin film formation (sputtering method) and the method is widely utilized as a new industrial technique. When considered from the viewpoint of thin film formation, this new technique has the following advantageous aspects. The method is applicable even to elements or compounds with a high melting point and a low vapor pressure, which are not usable or present many difficulties in film formation by vacuum evaporating. Although film formation by sputtering is slow as compared with the vacuum evaporation method, it can readily produce a uniform thin film with a high reproducibility without causing a substantial deviation in composition. Further, the film formed by sputtering strongly adheres to the substrate. This strong adhesion is greatly advantageous for film formation, but, when considered from the viewpoint of the production of fine particles, this property is considerably unfavorable and thus it has been considered that the sputtering technique can not be utilized for producing fine particles.

In view of the above, the inventors of the present invention carried out extensive studies, particularly on the production of fine particles by the sputtering method from among various physical vapor-phase deposition methods and arrived at a novel production method described hereinafter.

SUMMARY OF THE INVENTION

It is therefore a primary object of the present invention to provide a novel method of producing fine particles which eliminates the foregoing drawbacks or problems associated with the prior art, and particularly to produce amorphous or crystalline fine particles with a particle size of submicron or finer in a high yield by means of sputtering.

In accordance with the present invention, there is provided a method for producing fine particles which comprises sputtering metallic or non-metallic materials on a substrate having fine projections densely formed on the surface thereof, in an inert gas or a mixed gas of an inert gas with reactive gas, such as oxygen, the gas pressure of the inert gas or the mixed gas being in the range of $1 \times 10^{-4}$ to $1 \times 10^{-1}$ torr, and thereby depositing metallic or non-metallic fine particles having a crystalline or amorphous structure on the substrate.

In the invention method above, when ferromagnetic substances are selected as materials to be deposited on substrates, there are obtained fine particles especially suited for perpendicular magnetic recording media.

These and other objects and features of the present invention will be apparent from the following detailed description, taken with reference to the accompanying figures.

DETAILED DESCRIPTION OF THE PREFERRED EMBODIMENTS

Figure 1:
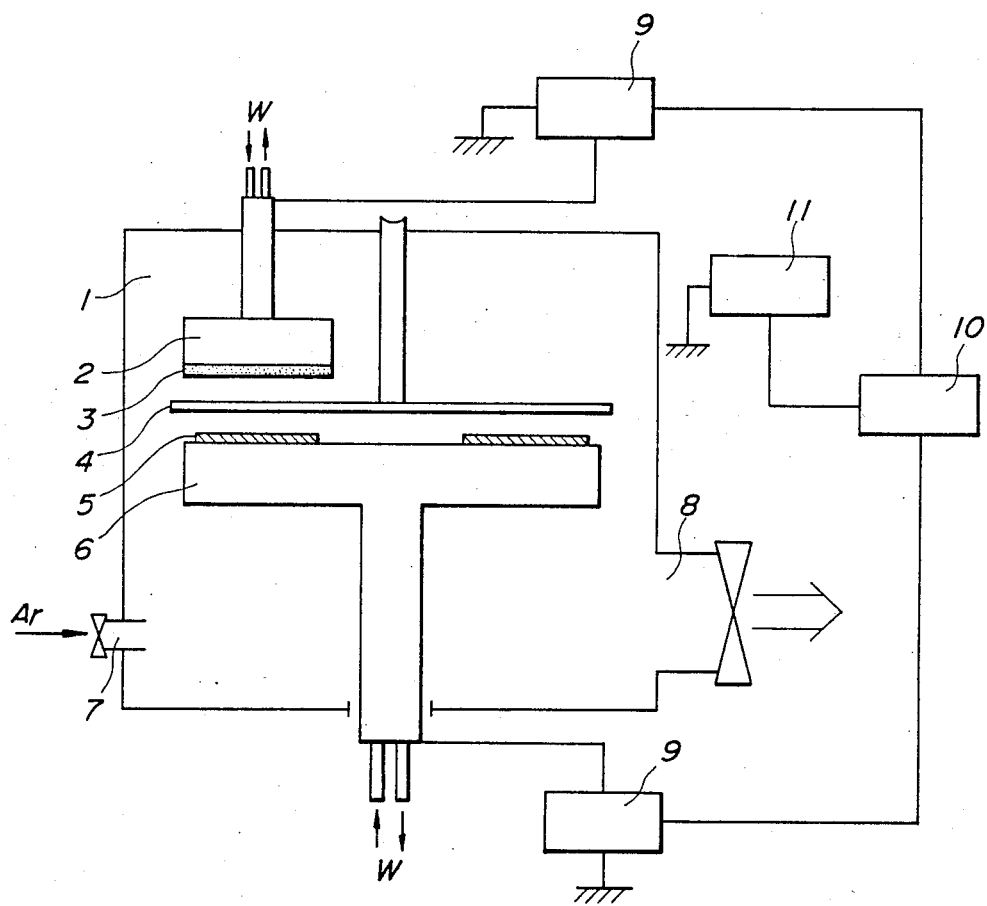
FIG. 1 is an illustrative view of an apparatus suitable for carrying out the present invention.

According to the present invention, firstly, a substrate is etched in advance by a sputter-etching process using an ionized gas whereby fine projections are uniformly and densely formed thereon. Besides the above sputter-etching process, chemical etching is also utilized with a view to forming the projections on substrate surfaces. Further, for the same purpose, a substrate may be pretreated by evaporating certain substances, which may be the same or not the same as the material of the substrate, onto the surface thereof; by coating on the surface thereof with certain substances; or by applying a treatment solution thereon and then evaporating only solvent to precipitate the solute in a dispersed state, etc.

After forming the fine projections on the substrate as set forth above, desired substances are deposited on the substrate by means of sputtering and, in this step, the fine projections act effectively as nuclei for the growth of the deposited substances and result in the desired fine particles.

When the projections on the substrate are less than 0.05 $\mu$m in height and/or less than 0.01 $\mu$m in diameter, they are too small to act as nuclei and, as a result, the substances deposited by sputtering will form a film. On the other hand, the projections with a diameter exceeding 5 $\mu$m will result in deposition of coarse particles with a large size of not less than 5 $\mu$m and, thus, the desired fine particles can not be obtained. Further, when the number of projections in a unit surface area is less than $1 \times 10^3/mm^2$, sputtered atoms enter even concavities of the substrate and a swelling thin film will be produced. On the other hand, when the number of projections exceeds $2 \times 10^8/mm^2$, since the distance between the projections is too small, an unfavorable aggregation of adjacent particles is unavoidably caused, thereby forming a thin film as in the above case. Therefore, the height, the diameter and the number of the projections in a unit surface area on a substrate surface are required to be 0.05 μm or higher, 0.01 to 5 μm and $1 \times 10^3$ to $2 \times 10^8/mm^2$, respectively. When the distribution and the size of the projections on subtrates are controlled in the ranges specified above, the distribution density of the fine particles deposited on the substrates can be very easily adjusted and, further, the growing particles can be readily controlled in their size and shape by appropriately varying the depositing time, quantity of an inert gas and applied voltage. As a result, the fine particles produced by this invention method are uniform in their size and shape and are dispersed at a high density on the substrate. In order to facilitate the removal of the particles deposited by the process of the present invention in a particle state from the substrate, it is preferable to coat the substrate with a substance that is soluble in solvents that do not dissolve the particles. The coating substance is treated to form the projections. The particles are then deposited on the projections. Then the coating substance is eluted with an appropriate solvent and the deposited particles are recovered.

The fine particles in accordance with the present invention can be used not only in the form of particles after being removed from the substrate, but also as raw materials with the substrate without being removed from it.

Generally, in the sputtering process, the temperature of the substrate rises with time whereby adhesion between the produced film and the substrate will be increased. An increase in temperature exceeding 300° C. limits the selection of substrate materials to a very narrow range and, further, makes it difficult to produce amorphous precipitates. For this reason, when amorphous fine particles are desired in the present invention, substrates are continuously cooled by using an appropriate coolant, such as water so as to prevent the rise of substrate temperatures exceeding 300° C., whereby amorphous fine particles are attainable.

As set forth above, the invention method of producing fine particles can control the particle size and shape and can provide successfully amorphous or crystalline particles having a composition which scarcely deviates from the composition of a target material, in high efficiency.

To further illustrate this invention, and not by way of limitation, the following examples are given.

EXAMPLES

FIG. 1 illustrates an embodiment of a sputtering apparatus employed to produce fine particles in accordance with the present invention. The apparatus is a high-frequency sputtering apparatus of a plane-parallel plate type in which three targets 3 are supported on a target supporting device 2 in a vacuum chamber 1. The target supporting device 2 and a substrate holder 6 are both hollowed out so as to allow water to circulate therein. Numerals 4 and 5 represent a mask and a substrate, respectively. Numerals 7 and 8 are an inlet and an outlet for an inert gas, respectively. Further, numerals 9, 10 and 11 designate a matching box, a change-over switch and a high frequency electric source, respectively.

Figure 2A:
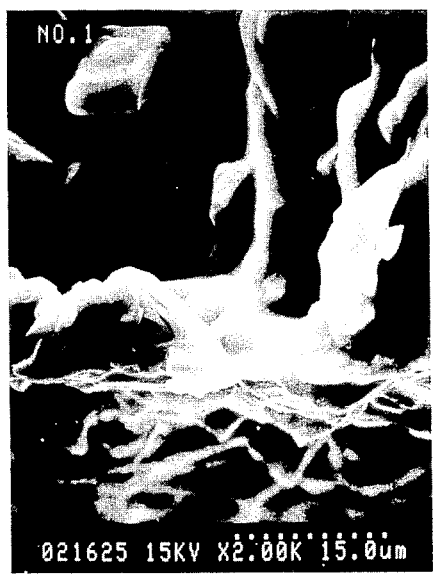
FIG. 2, (a) to (d) are scanning electron photomicrographs showing a substrate and deposited particles thereon.

The targets 3 having a diameter of 6 inches were prepared from alloys or oxides having various compositions given as listed in Table 1. The compositions in Table 1 are all indicated by atomic percentages. The substrates 5 of for Examples 1 to 12 were prepared by applying a boiling saturated aqueous solution of sucrose or by applying polystyrene onto a 0.2 mm thick cover glass and then drying. FIG. 2(a) is a scanning electron photomicrograph showing the surface of the substrate made of sucrose. Hereinafter, Example 1 is described as an example.

The substrate 5 was disposed in the vacuum chamber 1 and an argon gas was introduced from the gas inlet 7 for etching the substrate 5 and sealed in the chamber 1. The substrate 5 was etched for 40 minutes by the ionized argon gas under the following conditions.

High frequency power: 400 W
Pressure and flow rate of argon gas: $2 \times 10^{-2}$ torr and 80 cc/min., respectively.

Figure 2B:
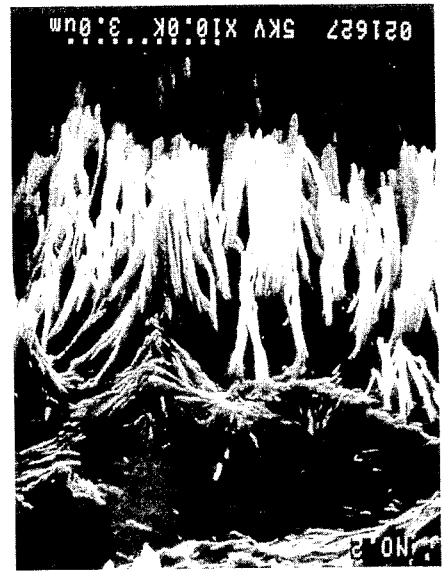

The thus etched substrate is shown in FIG. 2(b). As will be seen from FIG. 2(a) and (b), needle-like projections having a diameter of 700 to 1000Å and a length of 1.5 to 2.0 μm were formed on the substrate 5 by the above etching. Thereafter, sputtering was conducted on the substrate 5 under the following conditions and thereby sputtered atoms or molecules were deposited approximately perpendicular to the substrate.

High frequency power: 400 W
Pressure and flow rate of argon gas: $2 \times 10^{-2}$ torr and 80 cc/min., respectively.

Figure 2C:
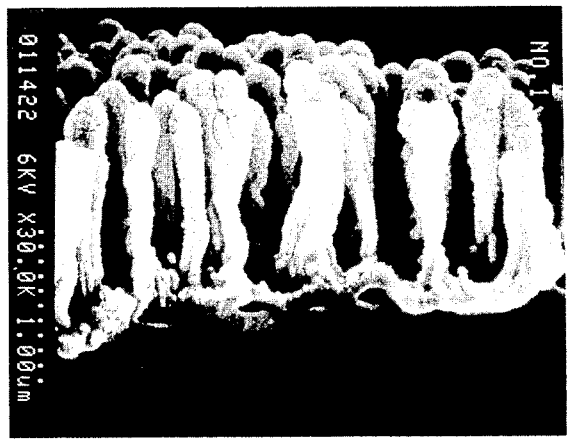

FIG. 2(c) shows a result after sputtering for the period of 40 minutes. As is clear from FIG. 2(c), sputtered atoms and molecules were deposited in a roughly columnar form on the microprojections formed on the surface of the substrate 5 and acting as nuclei. In the above etching step, it is possible to control the size and the distribution of the needle-like fine projections acting as nuclei for the fine particles by varying appropriately the conditions for the etching. Also, the size and shape of the produced fine particles can be controlled by adjusting the sputtering conditions.

Figure 2D:
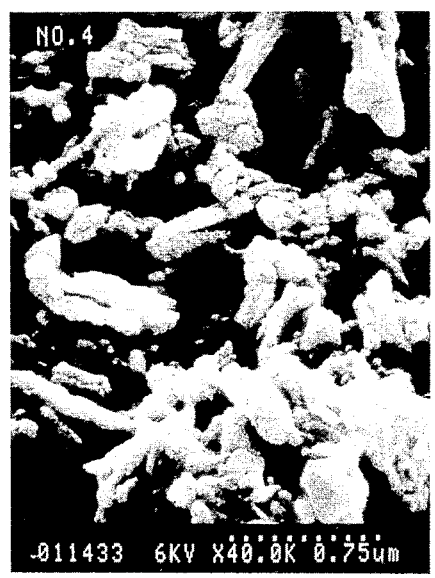

Further, the test piece shown in FIG. 2(c) was immersed in methanol and the deposited particles were separated from the substrate by means of ultrasonic radiation and were dried. The thus obtained fine particles were observed under a scanning electron microscope and the result is shown in FIG. 2(d). As shown in this figure, the resulting fine particles were proved to be in a columnar form having a diameter of around 2000Å and a length of from 10,000 to 15,000Å. Further, according to a further examination with the aid of an electron microscope having a higher resolving power, it was found that the particles are each made up of agglomerated finer particles each having a size of several hundred angstroms (Å). Also, the crystal structure analysis was conducted with X-ray diffraction meter using Mo tube bulb and, as a result, the structural analysis proved that the fine particles produced by this invention method are in an amorphous state.

Additional fine particles were prepared under the conditions given in Table 1, using substrates and targets of Examples 2 to 12. The thus produced fine particles were examined in the same way as in Example 1 and the results are shown in Table 1.

As is clear from the results in Table 1, amorphous metallic fine particles, which have heretofore been not known, as well as crystalline structure fine particles can be readily produced by the method of the present invention and, further, the produced particles are controllable in their size, structure, etc. by regulating appropriately the conditions of etching or sputtering, such as voltage, time, pressure of an argon gas, etc. For example, as in the case of a target of $Co_{76}Si_{10}B_{14}$ of Example 2, when sputtering was carried out under an applied power of 1 kW and an Ar gas pressure of not higher than $5\times10^{-3}$ torr, there were obtained crystalline fine particles of $Co_{76}Si_{10}B_{14}$.

Figure 3:
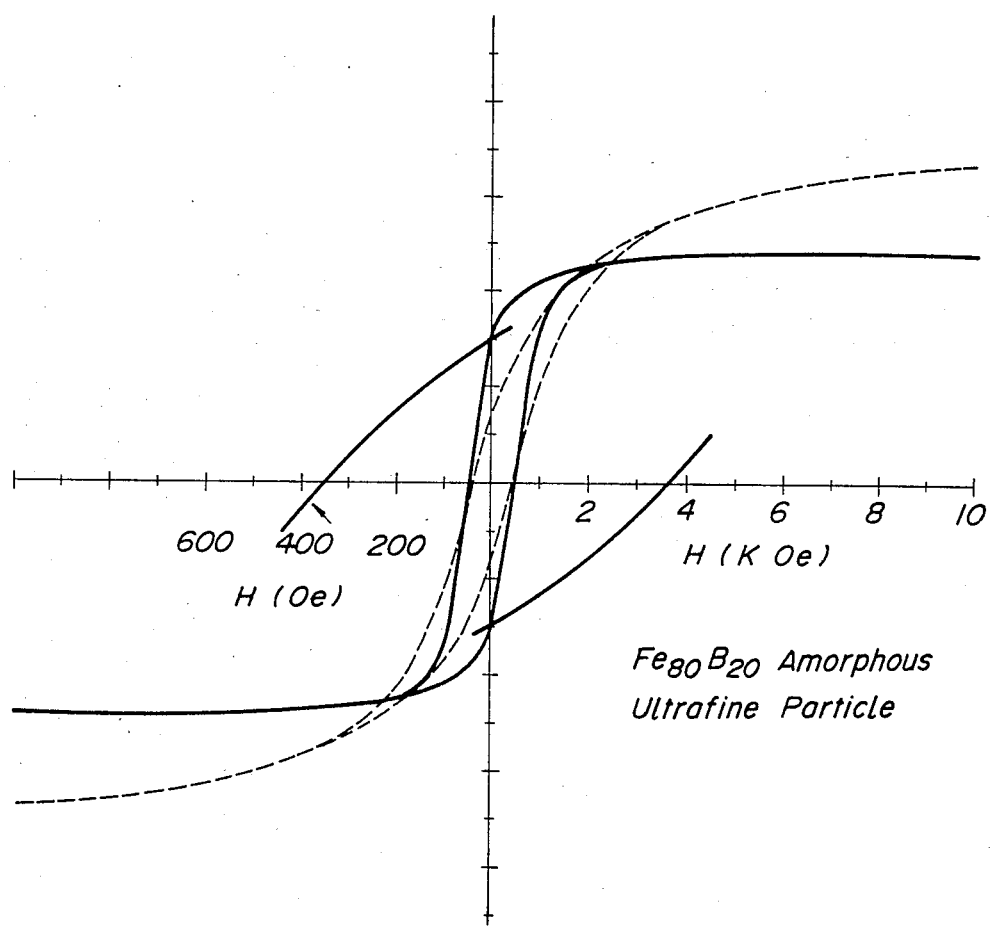
FIG. 3 is B-H Loop of the film constructed of fine particles of $Fe_{80}B_{20}$ alloy distributed on a substrate.

Further, $Fe_{80}$—$B_{20}$ of Example 13 alloy was used as the ferromagnetic substance and columnar-shaped fine particles of $Fe_{80}$—$B_{20}$ alloy with an amorphous structure uniformly deposited on an acrylic film substrate in a desired shape under the conditions given in Table 1. FIG. 3 shows the B-H Loop of the film which is constructed from the fine particles of $Fe_{80}$—$B_{20}$ distributed on the substrate. As will be seen from FIG. 3, an easy axis of magnetization of this film is perpendicular to the substrate plane.

TABLE 1

| Ex. No. | Materials of Targets | Materials of Substrates | Etching Power × Time | Power × Time | Particle Size (μm) and Form | Structure |
|---|---|---|---|---|---|---|
| 1 | $Co_{76}$—$Si_{10}$—$B_{14}$ | Sucrose | 400 W × 40 mins. | 400 W × 40 mins. | 0.05–0.2 Columnar | Amorphous |
| 2 | $Co_{76}$—$Si_{10}$—$B_{14}$ | Sucrose | 400 W × 40 mins. | 1000 W × 30 mins. | 0.1–0.3 Columnar | Crystalline |
| 3 | $Co_{76}$—$Si_{10}$—$B_{14}$ | Sucrose | 400 W × 40 mins. | 400 W × 60 mins. | 0.2–0.5 Columnar | Amorphous |
| 4 | $Co_{76}$—$Si_{10}$—$B_{14}$ | Polystyrene | 400 W × 40 mins. | 400 W × 40 mins. | 0.3–0.6 Massive | Amorphous |
| 5 | Ni—$Si_{17}$—$B_8$ | Polystyrene | 400 W × 40 mins. | 400 W × 40 mins. | 0.3–0.6 Massive | Amorphous |
| 6 | Ni—$Si_{17}$—$B_8$ | Sucrose | 400 W × 40 mins. | 400 W × 40 mins. | 0.03–0.3 Columnar | Amorphous |
| 7 | Ni—$Si_{17}$—$B_8$ | Sucrose | 200 W × 60 mins. | 200 W × 100 mins. | 0.05–0.1 Columnar | Amorphous |
| 8 | $Sm_2Co_5$ | Sucrose | 200 W × 60 mins. | 200 W × 100 mins. | 0.05–0.1 Granular | Amorphous |
| 9 | $Sm_2Co_{17}$ | Sucrose | 200 W × 60 mins. | 200 W × 100 mins. | 0.03–0.1 Columnar | Crystalline |
| 10 | $LiO$—$Bi_2O_3$ (40 mol %) | Sucrose | 200 W × 60 mins. | 600 W × 100 mins. | 0.3–0.6 Massive | Amorphous |
| 11 | $Fe_2O_3$ | Polystyrene | 400 W × 60 mins. | 600 W × 100 mins. | 0.3–0.6 Massive | Crystalline |
| 12 | $Fe_3O_4$—$Pb_2O_3$ (50 mol %) | Polystyrene | 400 W × 60 mins. | 400 W × 100 mins. | 0.3–0.6 Massive | Amorphous |
| 13 | $Fe_{80}$—$B_{20}$ | Acrylic film | 200 W × 100 mins. | 200 W × 60 mins. | 0.1–0.3 Columnar | Amorphous |

As is clear from the results listed in Table 1 and FIG. 3, this invention process has the undermentioned advantages:

(1) In any case of metals, alloys and oxides, fine particles can be obtained.

(2) The fine particles of the present invention are all submicron or finer in particle size.

(3) Regardless of materials of targets used in sputtering, a tendency to produce amorphous fine particles is increased with decrease in voltage applied during sputtering.

(4) Shapes of the resulting fine particles can be determined definitely to some extent by the selection of materials of substrates.

(5) It is also possible to obtain the columnar structure fine particles of ferromagnetic substance on the substrate.

As described above in detail, the method of producing fine particles in accordance with the present invention makes it possible, in both metallic and non-metallic substances, to produce fine particles having almost the same composition as that of the mother material which particles have not been obtained by any conventional process. Further, the invention process make it possible to obtain amorphous fine metal particles which have not been heretofore obtained, as noted in the Examples.

The amorphous or crystalline fine particles produced by this invention process are both very useful as the functional materials in the following applications.

(1) Main applications in magnetic recording media, absorber for radiation energy and various kinds of sensers, etc. In such applications, the invention particles are used together with a substrate, without being removed from the substrate.

(2) Applications in interfacial chemical reaction elements such as cell, catalyst, low-sintering media; filter, absorbent or adsorbent for hydrogen and the other gases, etc.

As is apparent from the above various applications, the fine particles of the present invention are of great value as industrial materials.

What is claimed is:

1. A method of producing fine particles comprising sputtering metallic or non-metallic materials onto a substrate having fine projections densely formed on the surface thereof, said fine projections having a height of at least 0.05 μm and a diameter ranging essentially from 0.01 to 5 μm and the number of said projections per unit area of said substrate being essentially in the range of $1\times10^3$ to $2\times10^8$ projections/mm², in an inert gas or a mixture of an inert gas and a reactive gas at a pressure in the range of $1\times10^{-4}$ torr to $1\times10^{-1}$ torr, and thereby depositing metallic or non-metallic fine particles having a crystalline or amorphous structure on said substrate.

2. A method as claimed in claim 1, wherein said fine projections are uniformly formed on said surface of said substrate by the sputter-etching method using an ionized gas.

3. A method as claimed in claim 1, wherein the temperature of said substrate during said sputtering is maintained within a temperature range not exceeding 300° C.

4. A method as claimed in claim 1, wherein the material sputtered on said substrate is a ferromagnetic material.

5. A method according to claim 1 in which said fine projections are made of a substance that is soluble in a solvent that does not dissolve said particles and wherein, after said fine particles have been deposited on said fine projections, said fine projections are dissolved with said solvent and said fine particles are recovered.

6. A method as claimed in claim 5 in which said substance is sucrose.

7. A method as claimed in claim 5 in which said substance is polystyrene.

8. A method as claimed in claim 4 in which said substrate is an acrylic film.

* * * * *